United States Patent [19]

Leuschner

[11] 3,914,698

[45] Oct. 21, 1975

[54] ELECTRONIC SELECTOR SYSTEM

[75] Inventor: Horst Leuschner, Dallas, Tex.

[73] Assignee: Texas Instruments Incorporated, Dallas, Tex.

[22] Filed: May 22, 1974

[21] Appl. No.: 472,329

[52] U.S. Cl. ......... 328/105; 178/DIG. 15; 325/390; 325/465; 328/44; 334/8; 340/147 C; 340/168 B

[51] Int. Cl.$^2$...H03K 17/02; H03K 21/00; H03J 1/00

[58] Field of Search .......... 328/44, 103, 105; 334/8, 334/11, 15; 178/DIG. 15; 325/390–394, 464, 465; 340/147 C, 168 R, 168 B, 168 CC, 168 S

[56] References Cited

UNITED STATES PATENTS 3,652,960 3/1972 Sakamoto et al. .................... 334/15

3,662,270 5/1972 Evans................................. 325/390

*Primary Examiner*—Siegfried H. Grimm

*Attorney, Agent, or Firm*—Hal Levine; James T. Comfort; James O. Dixon

[57] ABSTRACT

A selector system for energizing a selected one of a plurality of $2^n$ utilization devices wherein clock pulses are applied to an n stage up-down counter to cause it to count up or down in dependence on which of two input terminals receives the input signal; one stage of the counter activates a pair of output terminals alternately and the remaining stages of the counter activate a decoder to produce output signals on a plurality of $2^{n-1}$ other output terminals one at a time in sequence; feedback is applied selectively from any of the plurality of output terminals to either one of the input terminals through switching means.

10 Claims, 9 Drawing Figures

ELECTRONIC SELECTOR SYSTEM

This invention relates to an all-electronic switching system for television channel selectors.

In an effort to eliminate cost and reliability disadvantages of mechanical switch television channel selectors, especially those with remote control features, and to meet recent F.C.C. regulations requiring common UHF and VHF tuning systems, television tuners have been designed using a varactor diode as the principal tuning element. Generally, also, "step" tuners are preferred to the continuous type and so electronic tuners using integrated circuits embodying digitally controlled analog voltage switches to apply to the tuning diode a precise voltage magnitude to produce the required frequency of oscillation for the desired broadcast channel have been favored.

Because in any locality only a limited number of broadcast channels are available for viewing, tuner switches are often designed to offer only a limited selection, for example, a total of 14 or 16 channels, divided between the UHF and VHF bands. When fewer than 18 channels are offered, regulations require that each of the selectable channels can be preset or reset to any of the 82 broadcast channels of the TV spectrum.

Prior art electronic tuning switches generally have used some means such as a counter to generate a 4-bit digital code which is then decoded by logic circuitry to energize one of sixteen output lines which will activate the correct electronic switch to apply the proper voltage magnitude to the tuning diode for the broadcast channel selected. Such systems have required six or more integrated circuits to implement.

By the present invention, the essential elements of a sixteen channel electronic tuning switch are incorporated into only five integrated circuits using standard sixteen pin packages. One integrated circuit package contains an up-down counter, decode logic, clock oscillator, AFC defeat, supply voltage regulator and a power-on preset channel selector. The other four integrated circuit packages contain analog voltage switches to select and apply to a tuning element a voltage of the precise magnitude to generate a required frequency together with switches to apply power to a selected broadcast channel indicator and circuitry to disable all functions within the package. Through a unique feedback system and use of only partially decoded counter output, selection of 16 broadcast channels is provided using only ten outputs from the counter-logic device connected to the four switch devices. Provision is made for the system to be set always on the same broadcast channel when power is initially applied to the system. The system is operable by both direct access and remote control.

Therefore, it is an object of the present invention to provide a selector system for providing selection of one of a plurality of $2^n$ utilization devices using only $2^{n-1+2}$ output lines.

It is a further object of the present invention to provide an electronic selector system comprising a clocked n stage up-down counter with partially decoded outputs and feedback from the outputs to the input terminals providing automatic deactivation of the counter when the selected utilization device is energized.

These and other objects and features of the present invention will become apparent from the following detailed description taken together with the drawings wherein.

Figure 2:
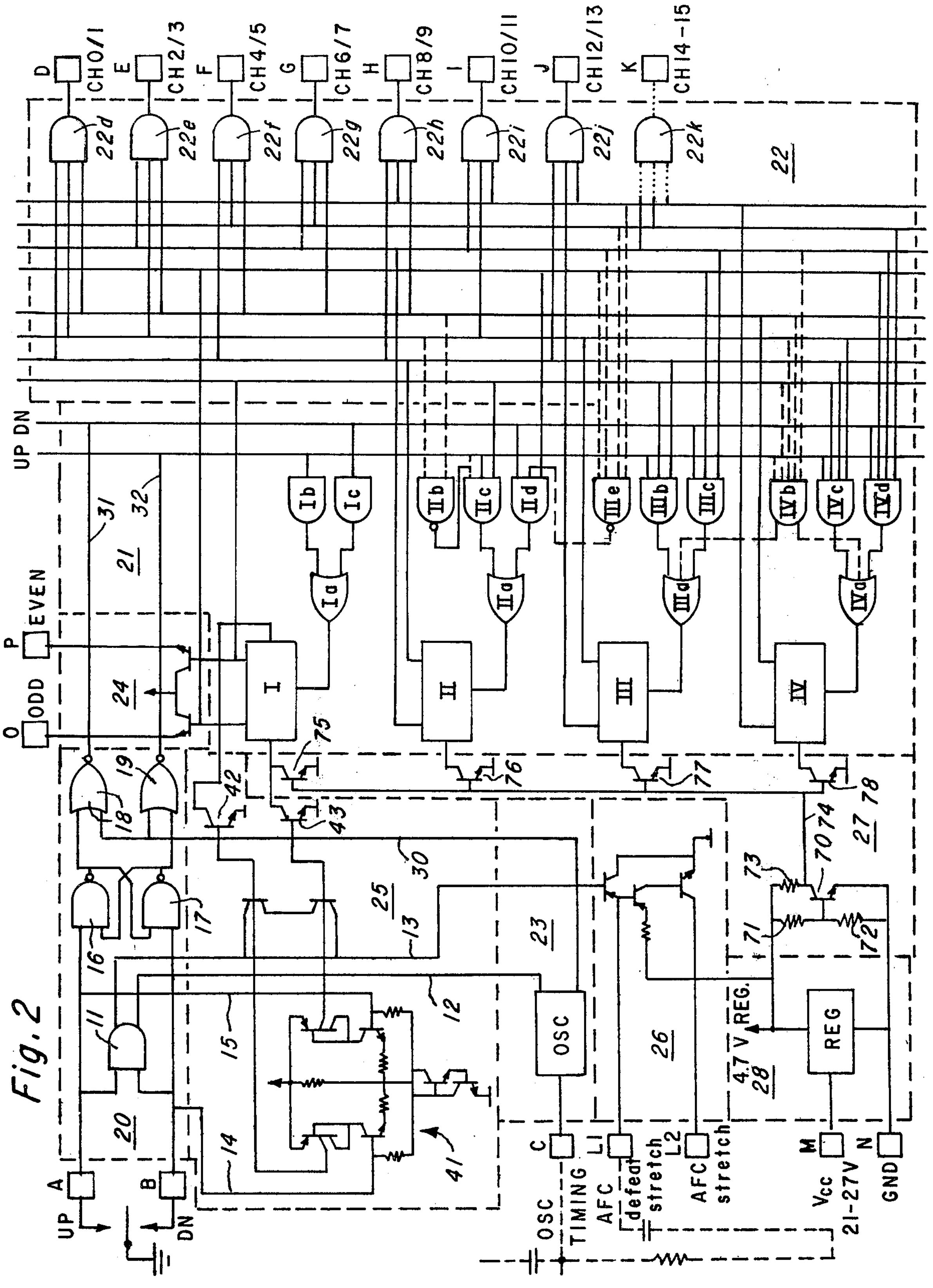
FIG. 2 illustrates schematically the counter, logic and other functional elements included in block 3 of FIG. 1.
Figure 3:
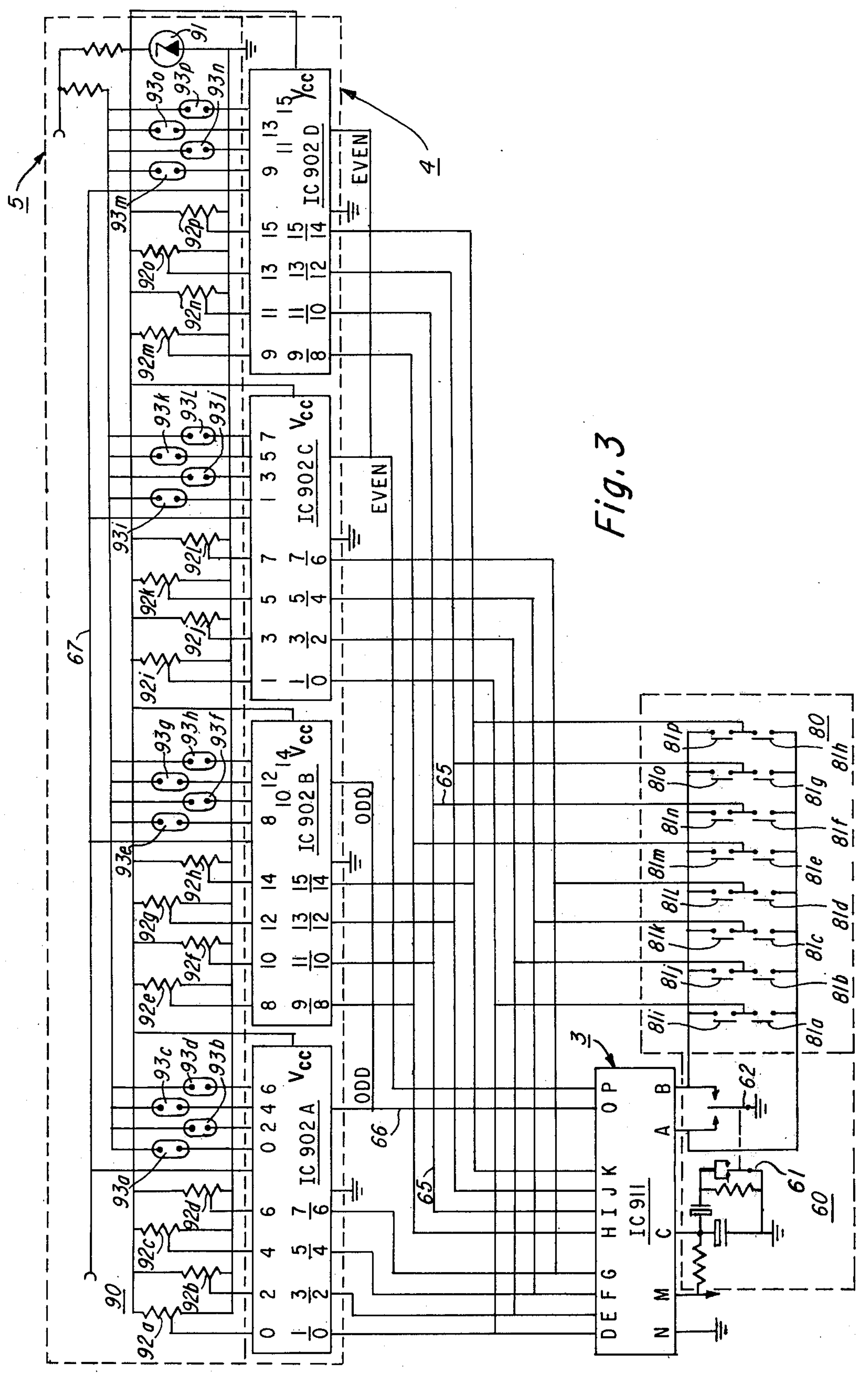
FIG. 3 illustrates schematically the elements of blocks 2, 3, 4 and 5 of FIG. 1 and their interconnection.
Figure 4A:
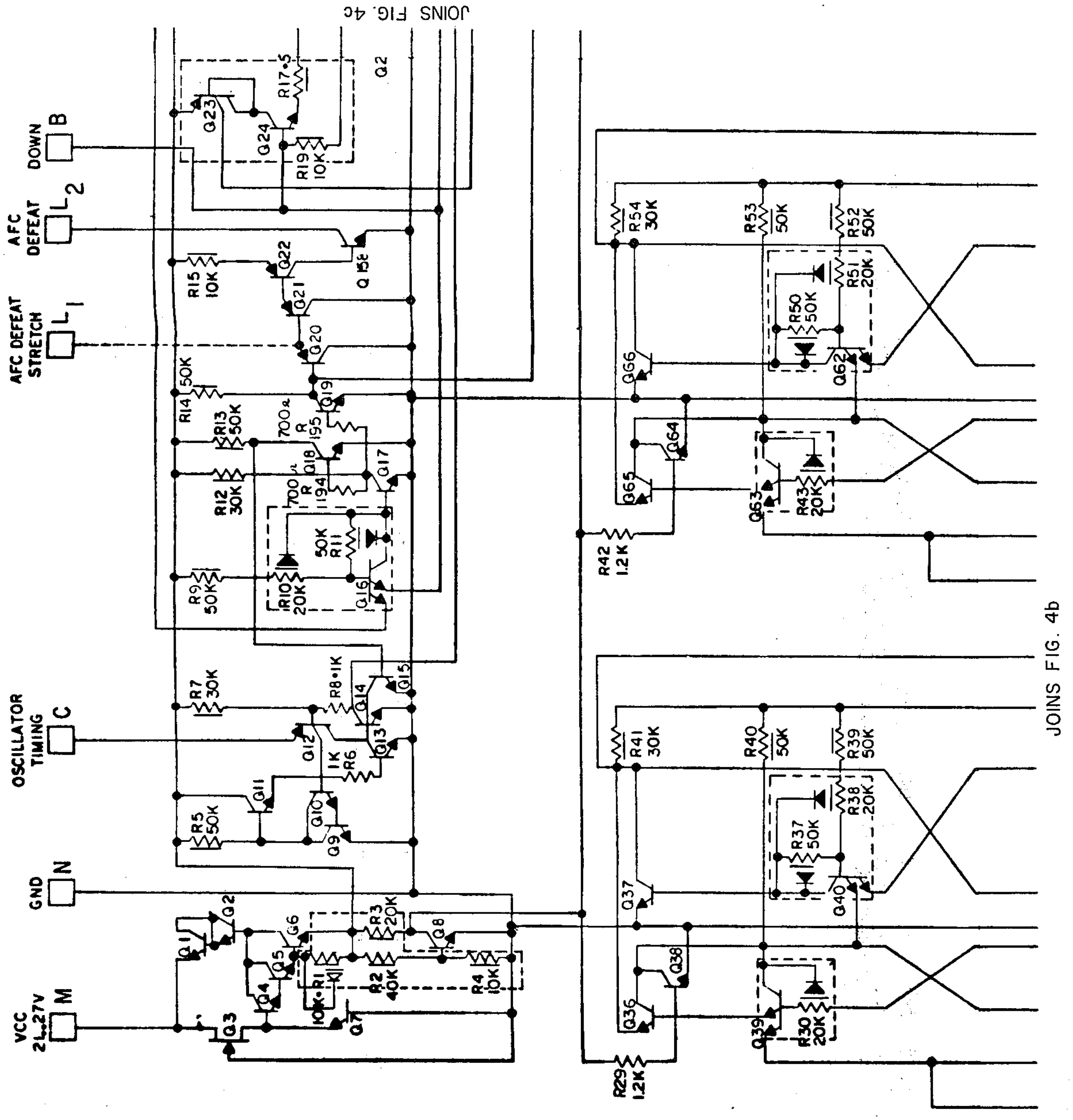
Figure 4B:
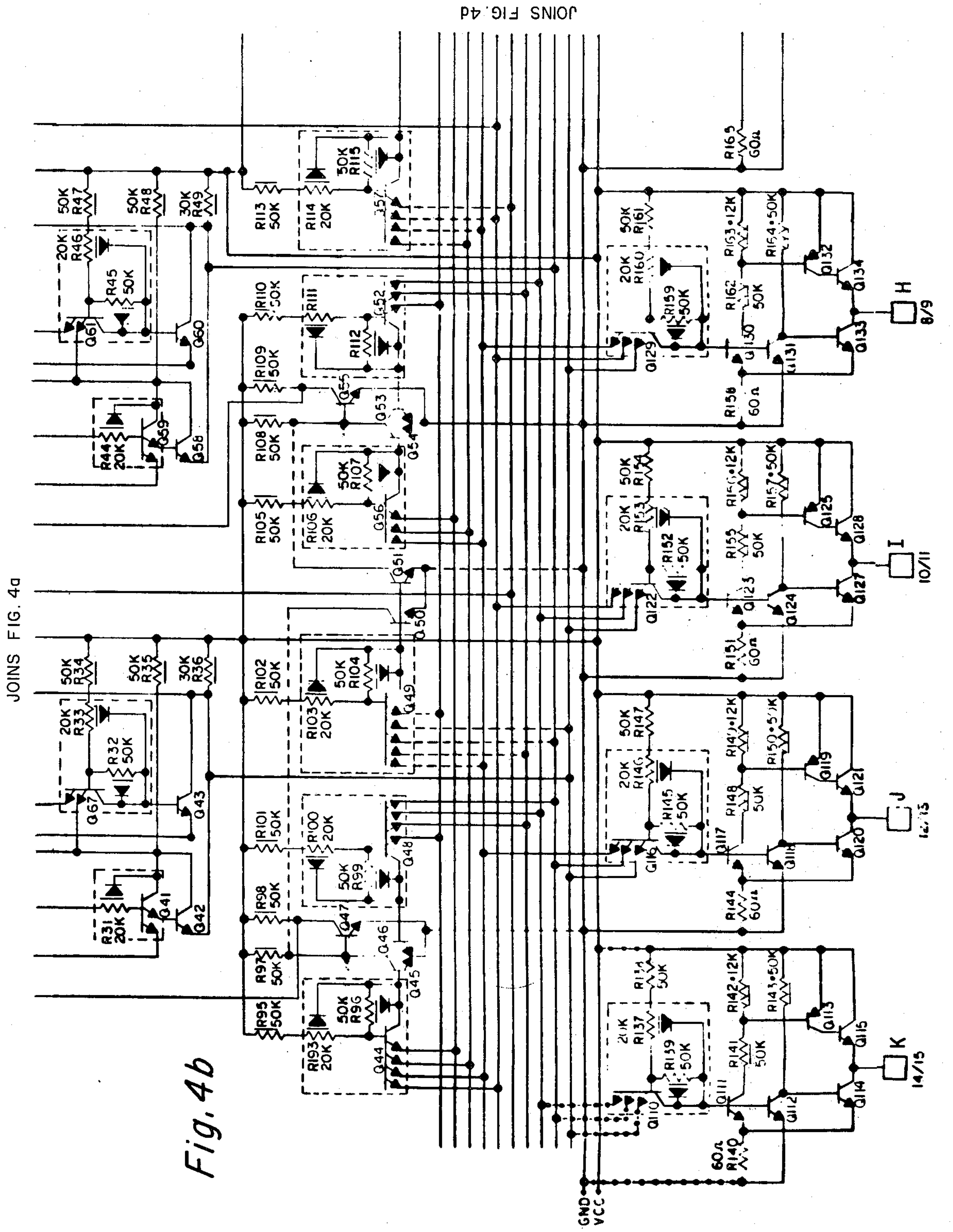
Figure 4C:
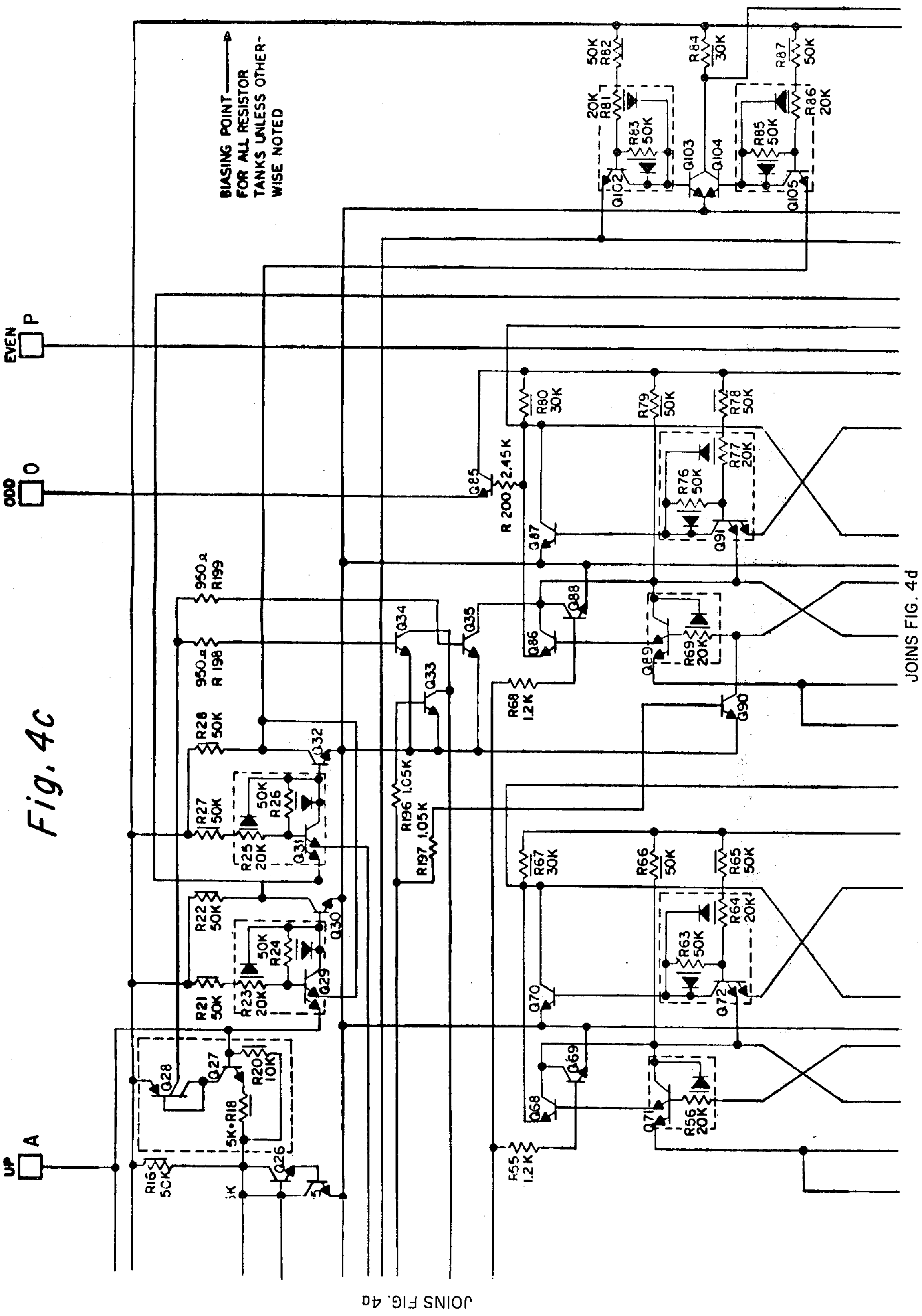
Figure 4D:
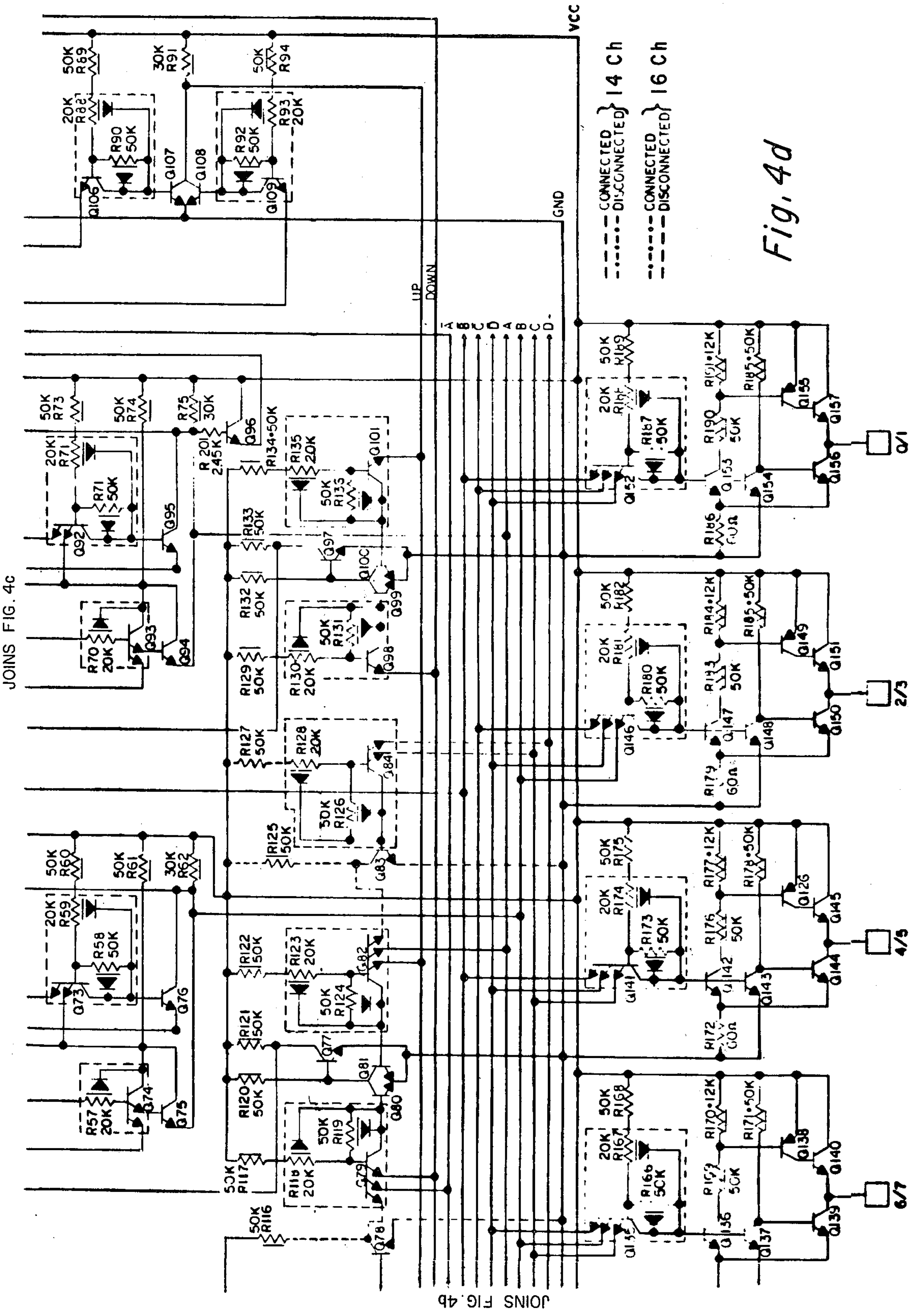
Figure 5A:
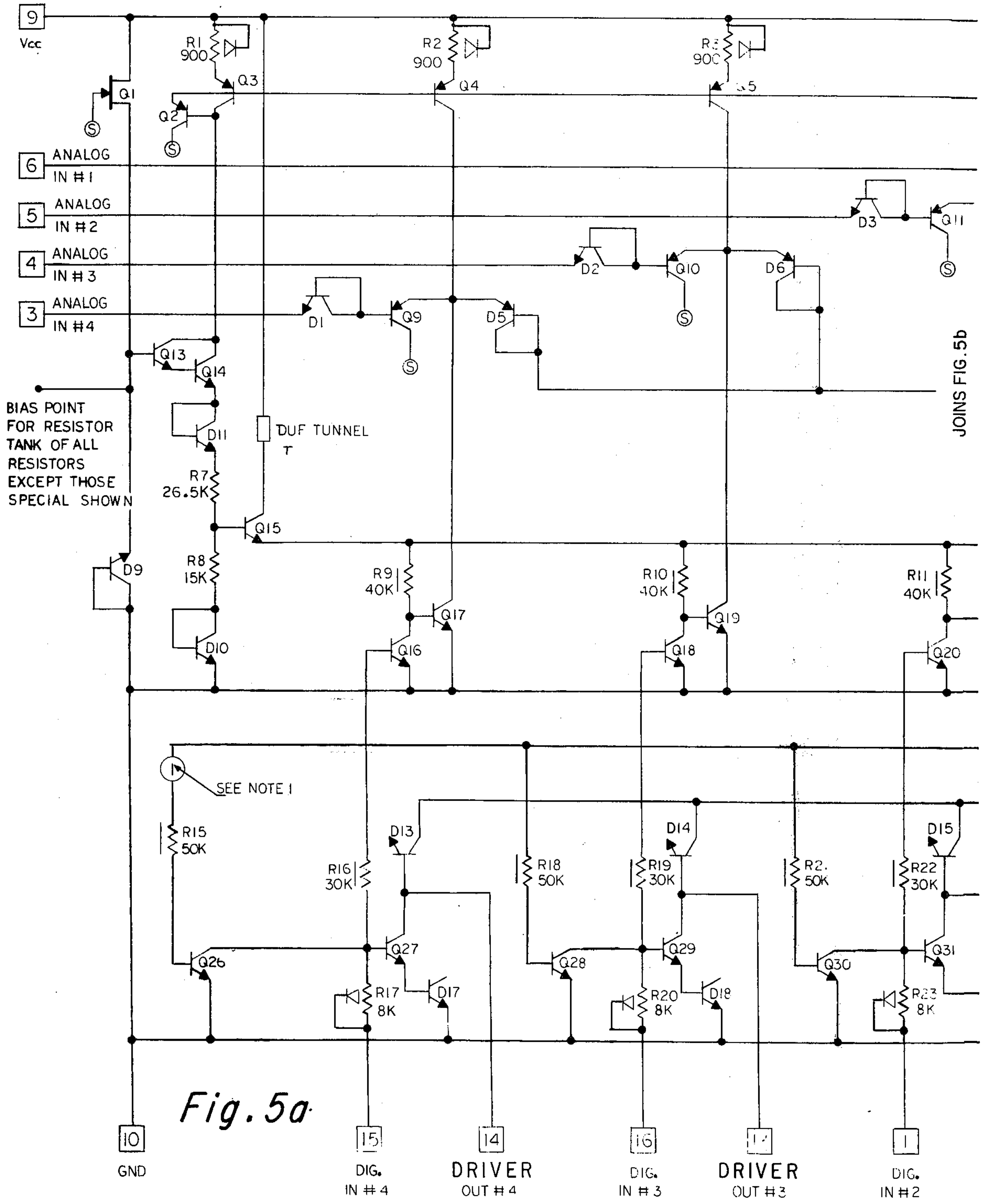
Figure 5B:
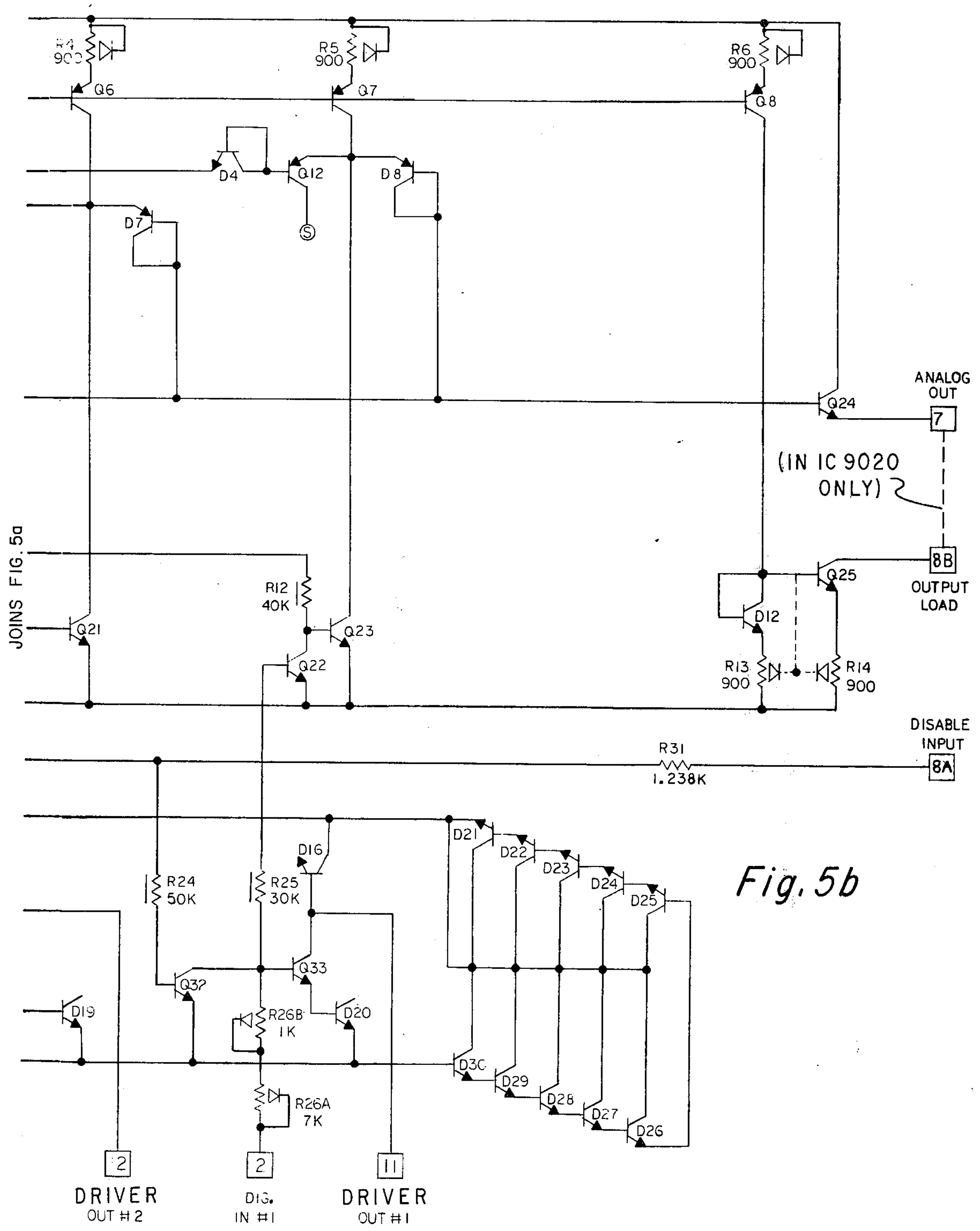

FIGS. 4*a* through 4*d* are schematic diagrams showing in detail the circuit of FIG. 2 which is IC 911 of FIG. 3; and FIGS. 5*a* and 5*b* are schematic diagrams showing in detail the switch circuits embodied in each one of the integrated circuits (IC 902) forming part of the system shown in FIG. 3.

Figure 1:
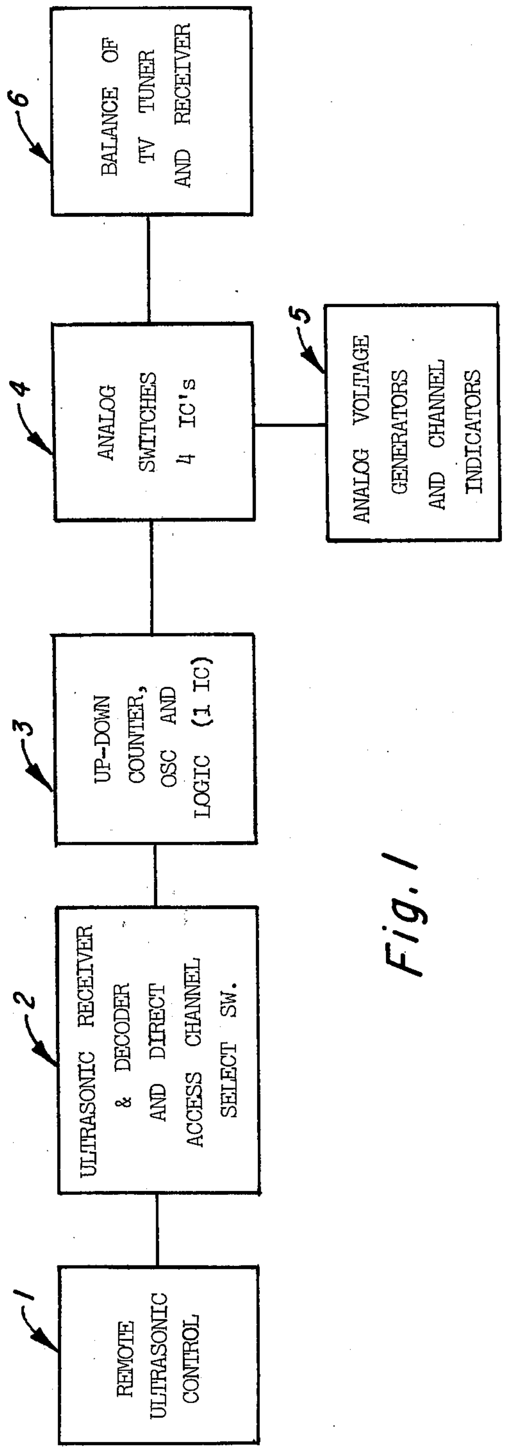
FIG. 1 is a block diagram of the general arrangement for a television receiver with remote control incorporating the present invention.

Turning now to FIG. 1, there is illustrated by a block diagram the general arrangement for a television receiver system in which the station selector switch of the present invention can be embodied.

Block 1 represents an ultrasonic remote control device of the usual type which the viewer can operate to produce and transmit to the receiver system any of a number of ultrasonic frequency signals representing desired control functions, among which are signals directing the television channel selector to begin switching to successively higher numbered broadcast channels until the desired channel is reached at which time the viewer stops the control signal. A different frequency signal may be used to command switching in the reverse direction, i.e., to switch to successively lower numbered broadcast channels, until the desired channel is reached. Such remote controlled transmitters are well-known in the art.

Block 2 represents an ultrasonic receiver which detects signals from the remote control transmitter and decodes them to produce electrical control functions which are delivered to other parts of the television receiver system to initiate and carry out the desired control function. Also, a part of Block 2 is the direct access channel selection control which allows the viewer to select the desired broadcast channel through pushbutton switches at the receiver. As is usual, there must be interaction or coordinated action between the remote control receiver and direct access controls. The circuitry of Block 2 is for the most part conventional but with modifications necessary for use with the all-electronic broadcast channel selector system of the present invention.

Block 3 contains an up-down binary counter, clock oscillator, logic, and other functions to provide the necessary control actions to operate the analog electronic switches of Block 4 in the present invention.

Block 5 includes a plurality of accurate analog voltage generators to supply the analog voltage of precise magnitude from which is selected the correct voltage to be applied to a varactor tuning diode to produce the oscillation frequency required for a particular broadcast channel. Block 5 also includes the generators to provide the proper drive voltages for broadcast channel indicators, which may be neon or incandescent lamps, for example.

Block 6 represents the balance of the television receiver system including the tuning diode, and associated circuits all of which may be of conventional design.

By the unique arrangement of the elements of Blocks 3 and 4 of FIG. 1, the present invention allows all of the elements of Block 3 to be incorporated into a single integrated circuit within a standard sixteen pin enclosure. Further, through the present invention all of the analog switching functions necessary, when used in conjunction with the integrated circuit device of Block 3, to provide unique station selection of one broadcast channel from up to sixteen or more available channels are provided using only four integrated circuits each packaged in a standard sixteen pin housing.

Turning now to the schematic diagram of FIG. 2 there are shown the logic and other functions included in the single integrated circuit of Block 3 of FIG. 1. The various input and ouput terminals of the device are shown as the shaded blocks A through P. The various functions included are set off within dashed-line blocks as follows: command signal input distributor 20; up-down counter logic 21; output decoder logic 22; clock generator 23; undecoded output 24; adjacent channel enable circuit 25; AFC defeat and/or sound muting 26; power-on channel preset 27; and supply voltage regulator 28.

In the operation of the device of FIG. 2 an input command signal is received at either input A to cause switching through successively higher broadcast channel numbers, or input B to cause switching through successively lower channel numbers until the selected or desired channel is reached. The differences in the remote and the direct access input operations will be discussed subsequently.

The incoming command indication (either the "up" or the "down" line connected to ground) is then directed to the other circuits by the logic of the command signal input distributor 20 as follows. The signal from either input is applied through AND gate 11 to the enable input line 12 of clock generator 23 and through line 13 to the AFC defeat-sound muting 26 to disable the tuner automatic frequency control and sound during channel selection. A signal from the B input (down) will be supplied on line 14 to one input of the adjacent channel enable circuit 25 while a signal on the A input (up) will be supplied on line 15 to another input of the adjacent channel enable circuit 25. As will be explained later, the adjacent channel enable circuit is activated only by a "true" level input signal, not by a ground level signal. The purpose of the output signals of circuit 25 will be discussed subsequently. Up signals are also applied to gate 16 or down signals to gate 17 (which gates constitute a latch circuit to overcome contact "bounce") to actuate gates 18 or 19 respectively to apply pulses from the enabled clock generator on line 30 to the appropriate up line 32 or down line 31 to initiate operation of the up-down counter 21.

Up-down counter 21 comprises flip-flops I through IV and logic gates $I_a$ through $I_c$, $II_a$ through $II_e$, $III_a$ through $III_c$ and $IV_a$ through $IV_d$. As those skilled in the art can detect from the connections illustrated, the counter 21 is activated by pulses on the up or down input lines to produce a binary coded bit count output to decoder 22 as well as an "odd" or "even" output to terminals O and P. The output of the counter 21 is only partially decoded before being applied to the output terminals D through K of the circuit of FIG. 2.

The outputs of flip-flop I are fed directly to output terminals O and P as odd or even indicators as well as to other counter elements as indicated. The outputs of flip-flops II, III and IV, i.e., the three most significant bits of the counter output, are fed to the decoder 22 such that one, but only one, of the output terminals D through K is activated by the bit combination applied to AND gates $22_d$ through $22_k$. As can be seen from the diagram, the odd and even outputs O and P are activated alternately with each clock pulse applied to flip-flop I whereas the activated output terminal of the terminals D through K is changed only once every two clock pulses. Thus, activation of output D selects either the $0^{th}$ or $1^{st}$ channel, output E the $2^{nd}$ and $3^{rd}$ channels, and so forth. These outputs in conjunction with the odd-even outputs O and P then offer unique selection of any of the sixteen broadcast channels using the ten output lines as will be explained in more detail in connection with FIG. 3.

A desirable feature of an all-electronic television tuner switch such as that of the present invention is to have the system provide preset tuning to the same broadcast channel each time the television receiver is turned on. Such a feature is provided in the single IC of FIG. 2 by the circuit of the power-on preset selector 27. Transistor 70 is biased from the regulated $V_{cc}$ output of regulator 28 by resistors 71, 72 and 73 to provide a "window" discriminator which produces a signal level output only when the voltage supplied to it is less than a preselected maximum. By this arrangement the output of transistor 70 to line 74 follows the increasing transient of the regulated $V_{cc}$ supply when power is turned on to a level of approximately one half the prescribed minimum operating voltage of the integrated circuit and thereafter quickly drops back down to less than a transistor threshold level where it remains with the full $V_{cc}$ regulated voltage operating level. There is thus produced a short pulse on line 74 when the television receiver is first turned on (power applied) which is fed through transistors 75–78 to the "clear" inputs of flip-flops I – IV thus insuring the same output terminals O or P and D through K are activated each time the receiver is turned "on".

The $V_{cc}$ regulator circuit 28 is provided to allow for a power saving internal $V_{cc}$ operating voltage of approximately 5 volts to be derived from the 21 to 27 volt $V_{cc}$ which is a commonly available internal supply in most solid state TV receivers of today.

It will be noted that FIG. 2 indicates seventeen external connections to the integrated circuit package said to be a standard sixteen pin package. In fact, only sixteen external connections are made to the integrated circuit of FIG. 2 but an option is provided to the television receiver manufacturer by the integrated circuit manufacturer. For full 16 channel selection only the "AFC defeat" output, $L_2$, is bonded to an output pin of the package. If only 14 channel selection is required, the AFC defeat output and the "AFC defeat stretch" are both connected to output pins. Also although the circuit shown in FIG. 2 may provide either fourteen or sixteen channel selection, slight differences in the interconnection of the gates of counter 21 and decoder 22 are required. For full sixteen channel selection the dashed-line interconnections are omitted and the dotted-line interconnections included, whereas for fourteen channel selection the dotted-line interconnections are omitted and the dashed-line interconnections included. These interconnection changes can be accomplished by using a slightly different interconnection mask in the last stage of manufacture of the integrated circuit of FIG. 2.

Turning now to FIG. 3, there is shown in greater degree of detail the elements of boxes 2, 3, 4 and 5 of FIG. 1 and their interconnections. In FIG. 3, IC 911 is the circuit of FIG. 2 (Block 3 of FIG. 1) connected in the sixteen-channel configuration; IC's $902_a$ through $902_d$ each contain circuits providing four zero-offset temperature-compensated analog switches and four display and band switch driver switches each receiving an actuating input in parallel with one of the zero-offset switches. These four IC's comprise Block 4 of FIG. 1. A disable circuit is provided to block operation of all of the switches of the integrated circuit device. IC's $902_a$ through $902_d$ are of the type available from Texas Instruments Incorporated of Dallas, Texas under the designation SN16902 or SN16901. FIGS. 5*a* and 5*b* schematically diagram detail of the decircuit of each of these commercially available devices but a detailed explanation of their operation is believed unnecessary.

The elements within the dashed-line Block 90 of FIG. 3 comprise Block 5 of FIG. 1 and include the supply voltage regulator 91 which supplies a precise voltage to the sixteen tuning voltage generators which may be individually adjustable potentiometers $92_a$ through $92_p$ and channel indicators $93_a$ through $93_p$ which may be illumination devices such as neon bulbs. A UHF-VHF band switch may be controlled by the same voltages supplied to the channel indicator devices. The dashed-line Block 80 includes direct access channel selector switches $81_a$ through $81_p$ and the dashed-line Block 60 includes circuits controlled by the ultrasonic receiver in response to signals received from the remote control transmitter 1 of FIG. 1. Blocks 60 and 80 are included in Block 2 of FIG. 1.

In operation of the system of FIG. 3, the viewer selects a desired broadcast channel by closing the one of the push-buttons switches 81 which corresponds to the channel he desires, switch $81_f$ for the tenth channel, for example. Closing switch $81_f$ interconnects the up line input A of IC 911 to the line 65 from output I of IC 911. Since all of the output lines D through K of IC 911 will be in the low logic state, i.e., ground, except the line for the channel pair to which the system had been previously tuned, input A is grounded and the counter of IC 911 will begin an up count and begin to activate successively higher output channels of IC 911 until output I is activated, i.e., receives a true logic signal from the counter. This true logic signal is fed through the closed switch $81_f$ to the up input A and thereby deactivates the counter. The true signal from output I is also fed on line 65 to the 10/11 inputs of both IC's $902_b$ and $902_d$. Because the counter is counting in the up direction the clock pulse which switches the counter output to output terminal I also causes the odd output to be activated and produces a true signal on line 66 which is fed to the disable inputs of the odd switches of IC's $902_a$ and $902_b$. IC $902_d$ upon receiving a signal at its input 10/11 from line 65 and being in its enabled state switches the tuning voltage from voltage generator $92_n$ which is applied to input $CH_{10}$ to output line 67 by which the voltage is applied to the tuning diode of the television receiver to select the proper frequency for the desired broadcast channel. At the same time the driver switch of IC $902_d$ operative in parallel with the channel 10 analog voltage switch is operated to apply power to indicator $93_n$ indicating channel 10 is the receiving channel.

Again, it should be noted that the 10/11 output I line will be energized for both the $10^{th}$ and $11^{th}$ channels but since the counter is "counting up" the $10^{th}$ channel is the first of the channel pair to be reached. Had the $11^{th}$ channel been selected, the counter would have been activated to "count down" (switch $81_n$ connected to the down input) and thus the 10/11 line would have first gone true when the higher of its two channels was reached, i.e., the $11^{th}$ channel.

Similar channel selection methods have been used in the prior art systems which provide fully decoded outputs from the counter, i.e., a unique output line for each broadcast channel rather than the partially decoded "shared-pair" system of the present invention. In the system of the present invention, as so far described, it would not be possible to switch from one channel of a shared-pair directly to the other channel of the pair without going through an intermediate channel selection because the output line for the desired channel is already at the true level. Direct selection of the adjacent channel of a pair is made possible by the circuit of box 25 of FIG. 2. When station channel selection is not in progress, all of the switches $81_a$ through $81_p$ are open and "up-down" inputs A and B are at an "indeterminate" level between true and ground by reason of an internally generated bias. Closing the switch $81_n$, for example, to select the $11^{th}$ channel when the television receiver is set on the $10^{th}$ channel previously selected will cause a true level logic signal to be applied to the down input B. This true level signal will not actuate the gates of signal distributor 20 nor the counter 21, but will energize the left side of the circuit 41 of FIG. 2 through line 14 to produce a pulse through transistor 42 to the "preset" input of flip-flop 1. This preset pulse switches flip-flop I and changes its output from even terminal P to odd terminal O without otherwise disturbing the system. In the same way, operation of switch $81_f$ to change from the $11^{th}$ channel to the $10^{th}$ channel produces a true signal on the up input A which is fed on line 15 to the right-hand side of circuit 41 to produce a clear pulse through transistor 43 to flip-flop I changing the output of that flip-flop from odd to even. A true level signal on either line 14 or 15 will also activate the AFC defeat circuit through either transistor 44 or transistor 45 which are fed in parallel with transistors 42 and 43 respectively.

A further feature of the present invention is the provision to operate the counter at two different clock rates in dependence on the source of the command signal, i.e., whether from remote control or from the direct access switch 80. The RC time constants of the circuitry of Block 60 of FIG. 3 are controlled by switches operated by the remote control receiver and are the mechanism by which the clock generator frequency for the system is set. When a channel selection is by the direct access selection switch of Block 80, switch 61 of the circuit of Block 60 remains open producing a very short time constant. The components of the time constant circuit of Block 60 may be chosen to produce a clocking frequency of about 16,000Hz, for example. At such a frequency, a complete "sweep" of the sixteen available broadcast channels by the switching system would require only about 1 millisecond and direct channel selection would appear instantaneous to the viewer. However, when channel switching is commanded by the remote control transmitter 1 the only signal received is an up-down command with no feedback as provided by the direct access switch 80. For this reason, the control operator must be given time to react to discontinue the remote command signal. Thus, reception of a remote command signal which acts to make the proper connection by switch 62 also closes switch 61 ganged thereto to change the time constant of the clock generator. A convenient time for a complete switching cycle for remote operation may be chosen to be about 8 to 10 seconds and thus the time constant of the circuit of box 60 may be on the order of about one-half second when switch 61 is closed.

Thus there has been disclosed an all-electronic television channel selection switch offering all of the features set forth at the beginning of this specification. It is intended that this invention be in no way limited by the above specific disclosure but only as set forth in the following claims.

What is claimed is:

1. A selector system for selectively energizing one of $2^n$ utilization devices comprising:

a. first and second input terminals;

b. a pair of output terminals;

c. $2^{n-1}$ additional output terminals;

d. means operative in response to and during the application of an input signal of a first logic level to one of said first and second input terminals to produce a signal of a second logic level at said pair of output terminals one at a time at a first predetermined frequency and to produce a signal of said second logic level at said $2^{n-1}$ output terminals one at a time at a second predetermined frequency different from but related to said first frequency in a first sequence when said input signal is applied to said first input terminal and in a reverse sequence when said input signal is applied to said second input terminal;

e. means operative in response to the application of an input signal of said second logic level to one of said input terminals to produce a signal of said second logic level at one of said pair of output terminals when said input signal of said second logic level is applied to said first input terminal and to produce a signal of said second logic level at the other of said pair of output terminals when said input signal of a second logic level is applied to said second input terminal;

f. a plurality of switching means each operative when activated to connect a different one of said $2^{n-1}$ output terminals to said first input terminal; and g. a second plurality of switching means each operative when activated to connect a different one of said $2^{n-1}$ output terminals to said second input terminal.

2. A selector system as defined in claim 1 wherein said first mentioned means comprises an n stage up-down counter and an $n-1$ to $2^{n-1}$ line decoder wherein the bit and bit complement outputs of one stage of said counter produce said signals at said pair of output terminals and the bit and bit complement outputs of the other stages of said counter are applied to said decoder to produce said signals at said $2^{n-1}$ output terminals.

3. A selector system as defined in claim 2 wherein said one stage of said counter is the least significant bit stage.

4. A selector system as defined in claim 2 wherein said second mentioned means produces clear and preset signals to said one stage of said counter.

5. A selector system as defined in claim 4 wherein said one stage of said counter is the least significant bit stage.

6. A selector system as defined in claim 1 wherein $n$ is equal to 4.

7. A selector system as defined in claim 2 wherein $n$ is equal to 4.

8. A selector system as defined in claim 5 wherein $n$ is equal to 4.

9. A switch selector system comprising a plural stage up-down counter providing bit outputs from each of said stages, an input circuit adapted to receive input signals of a first or a second type at either a first or second input terminal, said input circuit being operative to initiate and continue operation of said counter in a first sequence in response to and during the reception of an input signal of said first type at said first input terminal and to initiate and continue operation of said counter in an opposite sequence in response to and during the reception of an input signal of said first type at said second input terminal, a pair of output terminals receiving opposite logic level signals in dependence on the state of one stage of said counter, a plurality of additional output terminals receiving alternately in sequence opposite logic level signals, one of said logic level signals being received exclusively by each of said additional output terminals in sequence and in dependence on the state of the others of said counter stages, a plurality of normally open switching means each adapted to have two closed states and to connect different ones of said additional output terminals to said first input terminal when in a first closed state and to connect different ones of said additional output terminals to said second input terminal when in said second closed state.

10. A switch selector system as defined in claim 9 having in addition means responsive to a second type of input signal received at one of said first or second input terminals to establish a first or a second state of said one counter stage in dependence upon whether said second type input signal is received at said first or said second input terminal.

* * * * *